(12) United States Patent
Lee et al.

(10) Patent No.: US 12,487,517 B2
(45) Date of Patent: *Dec. 2, 2025

(54) BLANK MASK AND PHOTOMASK USING THE SAME

(71) Applicant: SK enpulse Co., Ltd., Pyeongtaek-si (KR)

(72) Inventors: GeonGon Lee, Seoul (KR); Suk Young Choi, Seoul (KR); Hyung-joo Lee, Seoul (KR); Suhyeon Kim, Seoul (KR); Sung Hoon Son, Seoul (KR); Seong Yoon Kim, Seoul (KR); Min Gyo Jeong, Seoul (KR); Hahyeon Cho, Seoul (KR); Taewan Kim, Seoul (KR); Inkyun Shin, Seoul (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 607 days.

This patent is subject to a terminal disclaimer.

(21) Appl. No.: 17/862,508

(22) Filed: Jul. 12, 2022

(65) Prior Publication Data

US 2023/0030141 A1 Feb. 2, 2023

(30) Foreign Application Priority Data

Jul. 13, 2021 (KR) .................. 10-2021-0091497

(51) Int. Cl.
*G03F 1/26* (2012.01)
(52) U.S. Cl.
CPC .................... *G03F 1/26* (2013.01)
(58) Field of Classification Search
CPC .............. G03F 1/26; G03F 1/54; G03F 1/84
See application file for complete search history.

(56) References Cited

U.S. PATENT DOCUMENTS 6,951,689 B1  10/2005 Higashikawa
10,261,409 B2  4/2019 Shishido et al.
(Continued)

FOREIGN PATENT DOCUMENTS

CN   105301890 A   2/2016
CN   106104371 A   11/2016
(Continued)

OTHER PUBLICATIONS

Chinese Office Action issued on Jul. 28, 2025, in corresponding Chinese Patent Application No. 202210817413.3 (14 pages in English, 1 page of Translator's Certification, 8 pages in Chinese).

*Primary Examiner* — Stewart A Fraser
(74) *Attorney, Agent, or Firm* — NSIP Law (57) ABSTRACT

Disclosed is a blank mask including a transparent substrate and a light shielding film disposed on the transparent substrate, wherein the light shielding film includes a transition metal and at least one selected from the group consisting of oxygen and nitrogen, wherein when a surface of the light shielding film includes nine sectors formed by trisecting the surface of the light shielding film vertically and horizontally, each of the nine sectors has a Rsk value, respectively, and an average value of the Rsk values of the nine sectors is equal to −0.64 or more and less than or equal to 0, where Rsk value is a height symmetry of the surface of the light shielding film measured in accordance with ISO_4287, and wherein an average value of Rku values, which are kurtosis of the surface of the light shielding film measured in accordance with ISO_4287, of the nine sectors is 3 or less.

18 Claims, 2 Drawing Sheets

(56) References Cited

U.S. PATENT DOCUMENTS

| | | | |
|---|---|---|---|
| 2009/0226826 A1* | 9/2009 | Nozawa | G03F 1/80 430/5 |
| 2012/0100470 A1 | 4/2012 | Nozawa et al. | |
| 2014/0329174 A1 | 11/2014 | Hamamoto et al. | |
| 2017/0023854 A1 | 1/2017 | Nam et al. | |
| 2017/0123120 A1 | 5/2017 | Shirouchi et al. | |
| 2017/0242330 A1 | 8/2017 | Hanekawa | |
| 2021/0048740 A1* | 2/2021 | Shishido | G03F 1/38 |
| 2022/0357647 A1* | 11/2022 | Lee | G03F 1/32 |

FOREIGN PATENT DOCUMENTS

| | | |
|---|---|---|
| CN | 106133599 A | 11/2016 |
| JP | 10-239043 A | 9/1998 |
| JP | 2000-265263 A | 9/2000 |
| JP | 2005-208282 A | 8/2005 |
| JP | 2006-146151 A | 6/2006 |
| JP | 2006-323236 A | 11/2006 |
| JP | 2011-112824 A | 6/2011 |
| JP | 2013-019766 A | 1/2013 |
| JP | 5483122 B2 | 5/2014 |
| JP | 5704773 B2 | 4/2015 |
| JP | 2017-120437 A | 7/2017 |
| JP | 2017-151427 A | 8/2017 |
| JP | 2018-17825 A | 2/2018 |
| JP | 2018-087998 A | 6/2018 |
| JP | 2018-205400 A | 12/2018 |
| KR | 10-2008-0071988 A | 8/2008 |
| KR | 10-2008-0093443 A | 10/2008 |
| KR | 10-2010-0035559 A | 4/2010 |
| KR | 10-2012-0057488 A | 6/2012 |
| KR | 10-1207724 B1 | 12/2012 |
| KR | 10-2014-0070660 A | 6/2014 |
| KR | 10-2014-0130420 A | 11/2014 |
| SG | 10202204528 P | 11/2022 |
| TW | 201534990 A | 9/2015 |
| TW | 202012469 A | 4/2020 |
| TW | 202113498 A | 4/2021 |

* cited by examiner

BLANK MASK AND PHOTOMASK USING THE SAME

CROSS-REFERENCE TO RELATED APPLICATIONS

This application claims the benefit under 35 USC 119(a) of Korean Patent Application No. 10-2021-0091497 filed on Jul. 13, 2021 in the Korean Intellectual Property Office, the entire disclosures of which are incorporated herein by reference for all purposes.

BACKGROUND

1. Field

The present disclosure relates to a blank mask and a photomask using the same.

2. Description of Related Art

Due to high integration of semiconductor devices or the like, miniaturization of circuit patterns of semiconductor devices is required. For this reason, the importance of a lithography technique, which is a technique for developing a circuit pattern on a wafer surface using a photomask, is being further emphasized.

For developing a miniaturized circuit pattern, a light source of exposure used in an exposure process (photolithography) is required to have a short wavelength. As the light source of exposure used recently, there is ArF excimer laser (wavelength of 193 nm) or the like.

As photomasks, there are Binary mask, Phase shift mask, and the like.

The Binary mask has a structure, in which a light shielding layer pattern is formed on a transparent substrate. On a surface, where a pattern is formed from the Binary mask, a transmissive portion not including a light shielding layer allows exposure light to be transmitted, and a light shielding portion including a light shielding layer shields exposure light, to transfer a pattern on resist film of a surface of a wafer. However, the Binary mask may cause a problem in the development of a minute pattern due to diffraction of light occurring at the edge of the transmissive portion as the pattern becomes further miniatured.

As a phase shift mask, there are Levenson type, Outrigger type, and Half-tone type. Among the above, Half-tone type phase shift mask has a structure, in which a pattern formed with semi-transmissive layer is formed on a transparent substrate. On a surface, where a pattern is formed from the Half-tone type phase shift mask, a transmissive portion not including a semi-transmissive layer allows exposure light to be transmitted, and a semi-transmissive portion including a semi-transmissive layer allows attenuated exposure light to be transmitted. The attenuated exposure light is allowed to have a phase difference compared to the exposure light, which has transmitted the transmissive portion. Accordingly, diffraction light occurring at the edge of the transmissive portion is counteracted by the exposure light, which has transmitted the semi-transmissive portion, and thereby the phase shift mask can form a further refined minute pattern on the surface of the wafer.

SUMMARY

In one general aspect, the blank mask according to one embodiment of the present disclosure includes a transparent substrate and a light shielding film disposed on the transparent substrate, wherein the light shielding film includes a transition metal and at least one selected from the group consisting of oxygen and nitrogen, wherein when a surface of the light shielding film includes nine sectors formed by trisecting the surface of the light shielding film vertically and horizontally, each of the nine sectors has a Rsk value, respectively, and an average value of the Rsk values of the nine sectors is equal to −0.64 or more and less than or equal to 0 where Rsk value is a height symmetry of the surface of the light shielding film measured in accordance with ISO_4287, and wherein an average value of Rku values, which are kurtosis of the surface of the light shielding film measured in accordance with ISO_4287, of the nine sectors may be 3 or less.

A standard deviation value of the Rsk values of the nine sectors may be 0.6 or less.

A standard deviation value of the Rku values of the nine sectors may be 0.9 or less.

A difference between a maximum value and a minimum value of the Rku values of the nine sectors may be 2.2 or less.

The maximum value of the Rku values of the nine sectors may be 4.6 or less.

A difference between a maximum value and a minimum value of the Rsk values of the nine sectors may be 1.7 or less.

A cross section of the light shielding film may include a center, a first edge at one end, and a second edge at another end, and when a thickness of the light shielding film measured at the center is Hc, a thickness of the light shielding film measured at the first edge is H1, and a thickness of the light shielding film measured at the second edge is H2, a greater of |Hc−H1| and |Hc−H2| may be less than 5 Å, where |Hc−H1| is an absolute value obtained by subtracting H1 from Hc and |Hc−H2| is an absolute value obtained by subtracting H2 from Hc.

The light shielding film may include a first light shielding layer and a second light shielding layer disposed on the first light shielding layer.

An amount of the transition metal of the second light shielding layer may be greater than an amount of the transition metal of the first light shielding layer.

The transition metal may include at least one selected from the group consisting of Cr, Ta, Ti, and Hf.

In another general aspect, the photomask according to another embodiment of the present disclosure includes a transparent substrate and a light shielding pattern film disposed on the transparent substrate, wherein the light shielding pattern film includes a transition metal and at least one selected from the group consisting of oxygen and nitrogen, wherein when an upper surface of the light shielding pattern film includes nine sectors formed by trisecting the upper surface of the light shielding pattern film vertically and horizontally, each of the nine sectors has a Rsk value, respectively, and an average value of the Rsk values of the nine sectors is equal to −0.64 or more and less than or equal to 0 where Rsk value is a height symmetry of the surface of the light shielding pattern film measured in accordance with ISO_4287, and wherein an average value of Rku values, which are kurtosis of the surface of the light shielding pattern film measured in accordance with ISO_4287, of the nine sectors may be 3 or less.

A standard deviation value of the Rsk values of the nine sectors may be 0.6 or less.

A standard deviation value of the Rku values of the nine sectors may be 0.9 or less.

A difference between a maximum value and a minimum value of the Rku values of the nine sectors may be 2.2 or less.

The maximum value of the Rku values of the nine sectors may be 4.6 or less.

A difference between a maximum value and a minimum value of the Rsk values of the nine sectors may be 1.7 or less.

A cross section of the light shielding pattern film may include a center, a first edge at one end, and a second edge at another end, and when a thickness of the light shielding pattern film measured at the center is Hc, a thickness of the light shielding pattern film measured at the first edge is H1, and a thickness of the light shielding pattern film measured at the second edge is H2, a greater of |Hc−H1| and |Hc−H2| may be less than 5 Å, where |Hc−H1| is an absolute value obtained by subtracting H1 from Hc and |Hc−H2| is an absolute value obtained by subtracting H2 from Hc.

The light shielding pattern film may include a first light shielding pattern layer and a second light shielding pattern layer disposed on the first light shielding pattern layer, and an amount of the transition metal of the second light shielding pattern layer may be greater than an amount of the transition metal of the first light shielding pattern layer.

The transition metal may include at least one selected from the group consisting of Cr, Ta, Ti, and Hf.

In another general aspect, the method of manufacturing the semiconductor element according to another embodiment of the present disclosure includes: disposing a light source, a photomask, and a semiconductor wafer including a resist film disposed on a surface of the semiconductor wafer; selectively transmitting a light incident from the light source through the photomask on the surface of the semiconductor wafer to be transferred; and developing a pattern on the surface of the semiconductor wafer, wherein the photomask includes a transparent substrate and a light shielding pattern film disposed on the transparent substrate, wherein the light shielding pattern film includes a transition metal and at least one selected from the group consisting of oxygen and nitrogen, wherein when an upper surface of the light shielding pattern film includes nine sectors formed by trisecting the upper surface of the light shielding pattern film vertically and horizontally, each of the nine sectors has a Rsk value, respectively, and an average value of the Rsk values of the nine sectors is equal to −0.64 or more and less than or equal to 0 where Rsk value is a height symmetry of the surface of the light shielding pattern film measured in accordance with ISO_4287, and wherein an average value of Rku values, which are kurtosis of the surface of the light shielding pattern film measured in accordance with ISO_4287, of the nine sectors may be 3 or less.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Hereinafter, example embodiments of the present disclosure will be described in detail with reference to the accompanying drawings so that they can be easily practiced by those skilled in the art to which the present invention pertains. However, the example embodiments may be embodied in many different forms and is not to be construed as being limited to the embodiments set forth herein.

In this disclosure, the term for degree like "about", "substantially" and the like is used for meaning values approximative from/to the value when a tolerance to be proper to referred meaning for manufacture and substance is presented. Additionally, these terms for degree are used to help understanding of example embodiments and to prevent that an unconscionable trespasser unjustly uses the presented content in which exact or absolute number is referred.

Throughout this disclosure, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this disclosure, the description of "A and/or B" means "A, B, or A and B."

Throughout this disclosure, terms such as "first", "second", "A", or "B" are used to distinguish the same terms from each other unless specially stated otherwise.

In this disclosure, "B being placed on A" means that B is placed in direct contact with A or placed over A with another layer or structure interposed therebetween and thus should not be interpreted as being limited to B being placed in direct contact with A.

In this disclosure, a singular form is contextually interpreted as including a plural form as well as a singular form unless specially stated otherwise.

In this disclosure, a room temperature refers to a temperature of 20° C. to 25° C.

In this disclosure, a pseudo defect refers to one disposed on a surface of a light shielding film, not corresponding to an actual defect, because it does not cause degradation of a resolution of a blank mask, while detected as a defect when detected by a highly sensitive defect detecting device.

Rsk value is a value evaluated in accordance with ISO_4287. The Rsk value shows height symmetry (skewness) of the surface profile of a measuring target.

Rku value is a value evaluated in accordance with ISO_4287. The Rku value shows kurtosis of the surface profile of a measuring target.

Peak is a profile portion disposed on an upper portion of a reference line (referring to a height average line from a surface profile) from a surface profile of a light shielding film.

Valley is a profile portion disposed on a lower portion of a reference line from a surface profile of a light shielding film.

In this disclosure, standard deviation refers to a sample standard deviation.

Due to high integration of semiconductor devices, miniaturization of circuit patterns of semiconductor devices is required. As the critical dimension (CD) of a pattern developed on a semiconductor wafer is further decreased, issues related to the resolution of a photomask, which is for developing the pattern, is on an increasing trend. According to the above, it is necessary to strictly prevent degradation of resolution caused from a minute defect for a blank mask and a photomask, and a defect inspection for the blank mask should be performed at a higher sensitivity. When the surface of the light shielding film is inspected under the highly sensitive condition, many pseudo defects may be detected as well as true defects. In addition, an additional inspection process may be required to distinguish true defects from the data of the inspection result, and the process for manufacturing a blank mask may be further complicated.

Meanwhile, the thickness of a light shielding film may have a variation depending on the position in the light shielding film, even though the variation is small. Such a thickness variation of the light shielding film may cause a variation of optical properties of the light shielding film in an in-plane direction of the light shielding film. Additionally, when such a light shielding film is patterned, a portion having a relatively thin thickness in the light shielding film may be etched excessively in the in-plane direction, while a potion having a relatively thick thickness may be etched insufficiently in the depth direction. As the critical dimension (CD) of the pattern developed on the semiconductor wafer is more decreased, the above problems may be easily caused by a small thickness variation in the in-plane direction of the light shielding film. Accordingly, the thickness variation of the light shielding film may be required to be further elaborately controlled.

The inventors of the present disclosure confirmed as follows through experiments. When the roughness distribution of a light shielding film in the in-plane direction is controlled, it is possible to provide a blank mask including a light shielding film, where true defects can be detected easily even under a highly sensitive detection.

Hereinafter, the detailed description of the present disclosure will be made.

Figure 1:
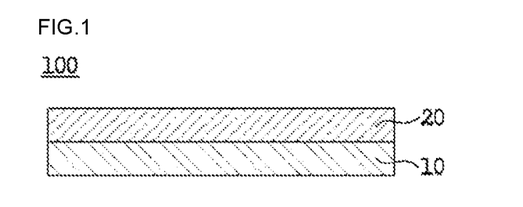
FIG. 1 is a conceptual view for illustrating the blank mask according to one embodiment of the present disclosure.

FIG. 1 is a conceptual view for illustrating the blank mask according to one embodiment of the present disclosure. With reference to the FIG. 1, an embodiment below is described in detail.

A blank mask 100 includes a transparent substrate 10 and a light shielding film 20 disposed on the transparent substrate 10.

Any material may be used as the transparent substrate 10 if the material has a light transmittance with respect to an exposure light and is being used in blank mask field. Specifically, the transmittance of the transparent substrate 10 with respect to an exposure light with the wavelength of 193 nm may be 85% or more. The transmittance may be 87% or more. The transmittance may be 99.99% or less. For example, the transparent substrate 10 may be a synthetic quartz substrate. In such a case, the transparent substrate 10 can suppress attenuation of light transmitting the transparent substrate 10.

The transparent substrate 10 can suppress occurrence of optical distortion by adjusting the surface characteristics such as flatness and roughness.

The light shielding film 20 may be disposed on the upper surface of the transparent substrate 10.

The light shielding film 20 may have a characteristic of blocking at least some of an exposure light incident from the lower surface of the transparent substrate 10. Also, when a phase shift film 30 is disposed between the transparent substrate 10 and the light shielding film 20 (referring to FIG. 3), the light shielding film 20 may be used as an etching mask in a process for etching the phase shift film 30 to have a pattern shape.

The light shielding film 20 includes a transition metal, and at least any one of oxygen and nitrogen.

Surface Roughness of Light Shielding Film

A surface of the light shielding film 20 includes nine sectors formed by trisecting the surface of the light shielding film 20 vertically and horizontally.

The surface of the light shielding film 20 has nine Rsk values, respectively, measured from the nine sectors, and an average value of the nine Rsk values may be equal to −0.64 or more and less than or equal to 0.

The surface of the light shielding film 20 has nine Rku values, respectively, measured from the nine sectors, and an average value of the nine Rku values may be 3 or less.

As the light shielding film 20 is formed by sputtering, peaks and valleys may be formed on the surface of the light shielding film 20. Some of the peaks and valleys may be considered as pseudo defects depending on a height and a shape thereof. When the distribution of peaks and valleys is not controlled, the frequency of detecting pseudo defects may be increased during a highly sensitive defect inspection.

To improve the accuracy of the highly sensitive defect inspection, a method, which decreases the surface roughness of the light shielding film 20 such as Ra value by using an etching gas, may be considered. However, due to the high sensitivity of the detecting equipment, even though the surface of the light shielding film has a low roughness characteristic, many pseudo defects may be still detected.

Incidentally, the inventors of the present disclosure confirmed that the skewness and kurtosis of the surface of the light shielding film are some of the factors influencing pseudo defect detecting, through experiments. In detail, the defect inspection is performed by irradiating an inspection light to the surface of a target, detecting, and analyzing the reflected light formed on the surface of the target to detect defects. The inspection light is reflected on the surface of the light shielding layer. Angle and strength of the reflected light may be varied depending on the characteristics of surface roughness. This may become a cause of degrading accuracy of the highly sensitive defect inspection.

The present disclosure accurately controls the average values of Rsk values and Rku values measured from respective sectors of the surface of the light shielding film 20, applies the structures of the layers, the composition of the layers, etc., of the light shielding film disclosed in the embodiment, thereby can effectively decrease the number of pseudo defects detected from the surface of the light shielding film. Particularly, the average values of Rsk values and Rku values, deviations of Rsk values and Rku values of each sector on the surface of the light shielding film 20 may be accurately controlled to prevent degradation of the accuracy effectively in a defect inspection.

The average values, deviations of Rsk values and Rku values of each sector on the surface of the light shielding film 20 may be adjusted by controlling the condition of a sputtering process, such as the distance between a substrate and a sputtering target, rotation speed of the substrate, etc., in the sputtering prosses. Independently of the above or simultaneously with the above, the thermal control, cooling treatment, etc., for the surface of the light shielding film immediately after the film formation may affect the surface characteristics. Also, factors that may affect the surface energy (such as the composition included in the light shielding film and the like) may affect the surface characteristics of the light shielding film. The detailed description of the controlling factors will be described in detail below.

A method of measuring Rsk values and Rku values from each sector on the surface of the light shielding film 20 is as follows.

The surface of the light shielding film 20 as an inspection target is divided into nine sectors formed by trisecting the surface vertically and horizontally. The Rsk value and Rku value from each sector on the surface of the light shielding film 20 are measured from the center of each sector. The center of each sector refers to an area of 1 μm vertically and horizontally disposed on the center of each sector.

The Rsk value and Rku value are measured in non-contact mode by setting a scan speed to be 0.5 Hz with a two-dimensional roughness meter. For example, XE-150 model available from PARK SYSTEM applied with PPP-NCHR as Cantilever model available from PARK SYSTEM as a probe may be used to measure Rsk value and Rku value of each sector.

The average value, standard deviation, etc., of Rsk values and Rku values are calculated from the Rsk values and Rku values measured at each sector.

The surface of the light shielding film 20 has nine Rsk values, respectively, measured from the nine sectors, and the average value of the nine Rsk values may be equal to −0.64 or more and less than or equal to 0. The average value of the nine Rsk value may be equal to −0.635 or more and less than or equal to −0.1. The average value of the nine Rsk value may be equal to −0.63 or more and less than or equal to −0.4.

The surface of the light shielding film 20 has nine Rku values, respectively, measured from the nine sectors, and the average value of the nine Rku value may be 3 or less. The average value of the nine Rku values may be 2.95 or less. The average value of the nine Rku values may be 2.9 or less. The average value of the nine Rku values may be 2.75 or more.

In such a case, the surface of the light shielding film 20 can have a characteristic in the surface roughness, which is even overall, and the formation of pseudo defects caused from the surface roughness can be effectively suppressed.

The deviations of Rsk values and Rku values measured from each sector of the surface of the light shielding film can be controlled. When the average value of Rsk values and Rku values measured from each sector on the surface of the light shielding film is controlled within a predetermined range and the deviations of Rsk values and Rku values are controlled, pseudo defects can be decreased on the surface of the light shielding film overall. Due to this, when the light shielding film is inspected for defects with a high sensitivity, the result with more accuracy can be obtained.

The surface of the light shielding film 20 has nine Rsk values, respectively, measured from the nine sectors, and the standard deviation value of the nine Rsk values may be 0.6 or less. The standard deviation value of the nine Rsk values may be 0.5 or less. The standard deviation of the nine Rsk values may be 0.4 or less. The standard deviation of the nine Rsk values may be 0.1 or more. In such a case, the skewness characteristic of each sector is controlled and pseudo defects occurring can be suppressed.

The surface of the light shielding film 20 has nine Rku values, respectively, measured from the nine sectors, and the standard deviation value of the nine Rku values may be 0.9 or less. The standard deviation value of the nine Rku values may be 0.85 or less. The standard deviation value of the nine Rku values may be 0.8 or less. The standard deviation value of the nine Rku value may be 0.6 or less. The standard deviation value of the nine Rku values may be 0.1 or more. The standard deviation value of the nine Rku values may be 0.5 or more. In such a case, the route of a reflected light generated from the surface of the light shielding film can be controlled, and detection of true defects may become easier.

The surface of the light shielding film 20 has nine Rku values, respectively, measured from the nine sectors, and the difference value between a maximum value and a minimum value of the nine Rku values may be 2.2 or less. The difference value may be 2.12 or less. The difference value may be 2 or less. The difference value may be 0.1 or more. In such a case, during a highly sensitive defect inspecting, degradation of accuracy of the defect inspection result caused from a scattering phenomenon of an inspection light can be effectively suppressed.

The maximum value of the nine Rku values may be 4.6 or less. The maximum value may be 4.3 or less. The maximum value may be 4.2 or less. The maximum value may be 4.1 or less. The maximum value may be 2 or more. In such a case, a scattering phenomenon of an inspection light due to some peaks having relatively high skewness values can be effectively suppressed.

The surface of the light shielding film 20 has nine Rsk values, respectively, measured from the nine sectors, and the difference value between a maximum value and a minimum value of the nine Rsk values may be 1.7 or less. The difference value may be 1.6 or less. The difference value may be 1.3 or less. The difference value may be 0.1 or more. In such a case, the skewness characteristic of all the sectors of the surface of the light shielding film 20 is adjusted in, and detection of true defects may become easier.

Thickness Distribution of Light Shielding Film

Figure 2:
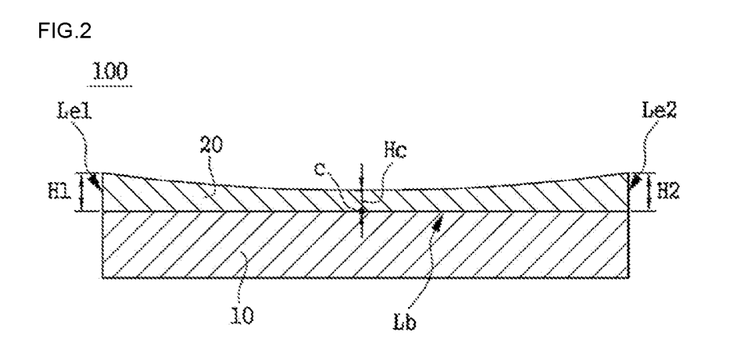
FIG. 2 is a conceptual view for illustrating a method of measuring a thickness distribution of a light shielding film.

FIG. 2 is a conceptual view for illustrating a method of measuring thickness distribution of alight shielding film from the section of the light shielding film. With reference to the FIG. 2, an embodiment is described.

When the light shielding film 20 is observed at the section, the section of the light shielding film 20 includes a first edge (Le1) as one end and a second edge (Le2) as the other end.

When the light shielding film 20 is observed at the section, the thickness of the light shielding film measured at the center of the section of the light shielding film is Hc, the thickness of the light shielding film measured at the first edge is H1, and the thickness of the light shielding film measured at the second edge is H2.

A larger value between |Hc−H1| value and |Hc−H2| value of the light shielding film may be less than 5 Å.

The |Hc−H1| value is the absolute value of a value obtained by subtracting H1 value from Hc value.

The |Hc−H2| value is the absolute value of a value obtained by subtracting H2 value from Hc value.

Before sputtering is performed, a sputtering target is installed to be tilted aslant with respect to the perpendicular direction of the surface of the transparent substrate 10 in a sputtering chamber. This is to prevent the surface, where a film is formed, from being polluted by particles generated from a surface of the sputtering target during the film formation.

To increase accuracy of a defect inspection for the surface of the light shielding film, a sputtering target may be installed at a position closer to the surface, where a film is formed during the formation of a light shielding film. Sputtering particles generated from the surface of the sputtering target is deposited to the surface where film is formed. As the distance between the sputtering target and the surface where the film is formed is closer, sputtering particles collide with the surface where the film is formed with a stronger energy to be deposited, and the formed light shielding film may have a relatively high density. Also, as the density of the light shielding film is higher, the surface may be induced to be more uniform. When the surface of the light shielding film as above is inspected for defects with a high sensitivity, it is possible to exhibit relatively high accuracy of the inspection, as confirmed through experiments.

However, when a sputtering target is installed to be tilted, in other words, not installed in the perpendicular direction of the surface of a film formation target, the distance between the surface where the film is formed and the sputtering target may become different depending on the position on the surface where the film is formed. As the distance between the sputtering target and the substrate surface is shorter, deposition may occur with more sputtering particles. In the outer portion of the surface where film is formed, which is placed relatively closer to the sputtering target, a thicker light shielding film may be formed compared to the center portion.

During processing of sputtering, the distance between one spot within the outer portion of the surface where the film is formed and the sputtering target has a larger variation compared to the distance between the center portion and the sputtering target. In such a case, sputtering particles having an energy distribution in a relatively wider range than may be deposited to the outer portion of the surface where the film is formed than the center portion. This may become a reason of degrading density of the outer portion of the light shielding film. A relatively rough surface may be formed in the light shielding film with low density.

Such a deviation in density may affect quality of a product, because the light shielding film of a blank mask should be patterned as an elaborated light shielding pattern film. Besides, the deviation of density is related to pseudo defects detected during a defect inspection.

The embodiment can control the average value of nine Rsk values and the average value nine Rku values of each sector of the surface of the light shielding film 20 and simultaneously control the thickness distribution of the light shielding film 20 in the in-plane direction. Through the above, it is possible to decrease the number of pseudo defects detected on the surface of the light shielding film 20 when a highly sensitive defect inspection is performed, and simultaneously, optical properties of the light shielding film 20 can be effectively prevented from variation in the in-plane direction.

The thickness distribution of the light shielding film observed at the section of the light shielding film may be controlled by controlling conditions for a sputtering process such as the distance between a sputtering target and a substrate and the rotation speed of the substrate during the formation of a light shielding film, or controlling conditions of thermal treatment and cooling treatment by districts within the surface of the light shielding film, and the layer structure of the light shielding film. The detailed description thereof is overlapped with the description of a manufacturing method of the light shielding film below and thus will be provided in detail below.

When the light shielding film 20 is observed at the section, the difference value between a thickness measured at the center of the light shielding film 20 and a thickness measured at each edge of the light shielding film 20 is measured by a method as follows.

An image of a section of the light shielding film 20 as a measuring target is measured through TEM (Transmission Electron Microscopy) measuring equipment.

From the image of the section of the light shielding film 20, a first edge (Le1) and a second edge (Le2) are determined, and H1 as the thickness of the light shielding film at the first edge (Le1) and H2 as the thickness of the light shielding film at the second edge (Le2) are measured.

From the image of the section of the light shielding film 20, the thickness of the light shielding film Hc, which is measured at the center of the section of the light shielding film, is measured. Hc is a thickness of the light shielding film measured at the center spot (c). The center spot (c) is a point placed at the center of an interface (Lb) formed between the light shielding film 20 and the transparent substrate 10. When another thin film is disposed between the light shielding film and the transparent substrate, the center spot is a point placed at the center of an interface formed between the light shielding film and the other thin film.

A larger value between |Hc−H1| value and |Hc−H2| value is calculated from the measured H1, H2 and Hc values.

For easier FIB (Focused Ion Beam) treatment for the surface of the light shielding film as a measuring target, the center portion and the outer portion of one blank mask may be cut in regular areas to manufacture plural samples as measuring targets. In detail, a portion corresponding to the area of 5 cm vertically and horizontally placed at the center of the blank mask as a measuring target is cut to manufacture a first sample. A portion corresponding to an area of 5 cm vertically and horizontally placed at the left of the center including one side of the blank mask is cut to manufacture a second sample. A portion corresponding to an area of 5 cm vertically and horizontally placed at the right of the center including the other side opposite to the one side of the blank mask is cut to manufacture a third sample.

Hereinafter, the upper surfaces of the first sample, second sample and third sample (that is, the surface of the light shielding film) are treated by FIB (Focused Ion Beam).

After the FIB treatment, an image of a section of the first sample is obtained through TEM measuring equipment, and Hc value is measured from the image of a section. Also, images of section of the second sample and the third sample are obtained through TEM measuring equipment. H1 value and H2 value are measured from each image of a section, and a larger value between a |Hc−H1| value and a |Hc−H2| is calculated.

For example, TEM image of each sample may be measured by using JEM-2100F HR model available from JEOL LTD.

The larger value between |Hc−H1| value and |Hc−H2| value may be less than 5 Å. In such a case, variation of optical properties of the light shielding film in the in-plane direction can be substantially suppressed.

Composition and Layer Structure of Light shielding Film

Figure 3:
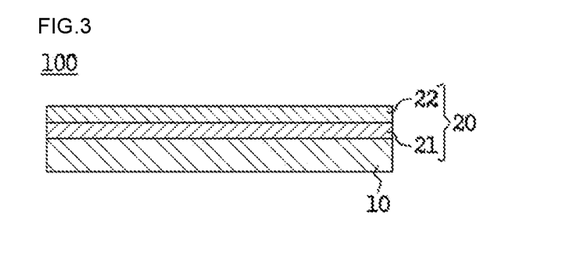
FIG. 3 is a conceptual view for illustrating the blank mask according to another embodiment of the present disclosure.

FIG. 3 is a conceptual view for illustrating a blank mask 100 according to another embodiment of the present disclosure. With reference to the FIG. 3, an embodiment is described.

A light shielding film 20 may include a first light shielding layer 21 and a second light shielding layer disposed on the first light shielding layer 21.

The second light shielding layer 22 may include a transition metal and at least any one of oxygen and nitrogen. The second light shielding layer 22 may include a transition metal in an amount of 50 at % to 80 at %. The second light shielding layer 22 may include a transition metal in an amount of 55 at % to 75 at %. The second light shielding layer 22 may include a transition metal in an amount of 60 at % to 70 at %.

The amount of an element corresponding to oxygen or nitrogen of the second light shielding layer 22 may be 10 at % to 35 at %. The amount of an element corresponding to oxygen or nitrogen of the second light shielding layer 22 may be 15 at % to 25 at %.

The second light shielding layer 22 may include nitrogen in an amount of 5 at % to 20 at %. The second light shielding layer 22 may include nitrogen in an amount of 7 at % to 13 at %.

Figure 4:
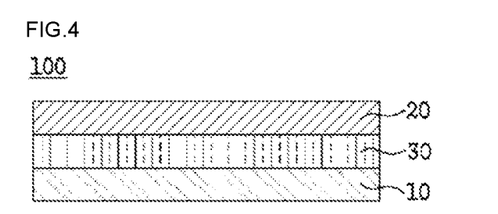
FIG. 4 is a conceptual view for illustrating the blank mask according to another embodiment of the present disclosure.

In such a case, it is possible to help the light shielding film 20 blocking an exposure light substantially with a phase shift film 30 (Refer to FIG. 4).

The first light shielding layer 21 may include a transition metal, oxygen, and nitrogen. The first light shielding layer 21 may include a transition metal in an amount of 30 at % to 60 at %. The first light shielding layer 21 may include a transition metal in an amount of 35 at % to 55 at %. The first light shielding layer 21 may include a transition metal in an amount of 40 at % to 50 at %.

The sum of the oxygen amount and the nitrogen amount of the first light shielding layer 21 may be 40 at % to 70 at %. The sum of the oxygen amount and the nitrogen amount of the first light shielding layer 21 may be 45 at % to 65 at %. The sum of the oxygen amount and the nitrogen amount of the first light shielding layer 21 may be 50 at % to 60 at %.

The first light shielding layer 21 may include oxygen in an amount of 20 at % to 40 at %. The first light shielding layer 21 may include oxygen in an amount of 23 at % to 33 at %. The first light shielding layer 21 may include oxygen in an amount of 25 at % to 30 at %.

The first light shielding layer 21 may include nitrogen in an amount of 5 at % to 20 at %. The first light shielding layer 21 may include nitrogen in an amount of 7 at % to 17 at %. The first light shielding layer 21 may include nitrogen in an amount of 10 at % to 15 at %.

In such a case, the first light shielding layer 21 may help the light shielding film 20 to have an excellent extinction characteristic.

The transition metal may include at least any one selected from the group consisting of Cr, Ta, Ti, and Hf. The transition metal may be Cr.

The film thickness of the first light shielding layer 21 may be 250 Å to 650 Å. The film thickness of the first light shielding layer 21 may be 350 Å to 600 Å. The film thickness of the first light shielding layer 21 may be 400 Å to 550 Å. In such a case, the first light shielding layer 21 can help the light shielding film 20 blocking an exposure light effectively.

The film thickness of the second light shielding layer 22 may be 30 Å to 200 Å. The film thickness of the second light shielding layer 22 may be 30 Å to 100 Å. The film thickness of the second light shielding layer 22 may be 40 Å to 80 Å. In such a case, the second light shielding layer 22 improves the extinction characteristic of the light shielding film 20 and can help the side surface profile of a patterned light shielding film formed from the light shielding film 20 is patterned to be controlled further elaborately.

The ratio of the film thickness of the second light shielding layer 22 to the film thickness of the first light shielding layer 22 may be equal to 0.05 or more and less than or equal to 0.3. The ratio of the film thickness may be a value of 0.07 to 0.25. The ratio of the film thickness may be a value of 0.1 to 0.2. In such a case, a patterned light shielding film can have controlled side surface profile as well as a sufficient extinction characteristic.

The amount of a transition metal of the second light shielding layer 22 may be greater than the amount of a transition metal of the first light shielding layer 21.

A second light shielding layer 22 is required to have a greater amount of a transition metal compared to a first light shielding layer 21, for controlling the side surface profile of a patterned light shielding film, which is formed by patterning a light shielding film 20, further elaborately and, for the reflective index of the surface of the light shielding film with respect to an inspection light to have a value suitable to the inspection during a defect detecting. However, in such a case, recovery, recrystallization, and the growth of a crystal grain may occur in the second light shielding layer 22 when a thermal treating is processed to the formed light shielding film 20. When the growth of a crystal grain occurs in the second light shielding layer 22, in which a transition metal is included in a high amount, the roughness characteristic of the surface of the light shielding film 20 may be excessively changed by particles of the transition metal grown excessively. This may be a cause of generating many pseudo defects on the surface of the light shielding film.

The embodiment can control the average value of nine Rsk values measured from sectors of the light shielding film 20 while having a larger value in the amount of a transition metal in the second light shielding layer 22 than the amount of the transition metal in a first light shielding layer 21. Through the above, it is possible to decrease the number of pseudo defects detected on the surface of the light shielding film 20, effectively, in addition to allowing the light shielding film 20 to have desired optical properties and etching characteristics.

Optical Properties of Light Shielding Film

The transmittance of a light shielding film 20 with respect to a light with wavelength of 193 nm may be 1% or more. The transmittance of the light shielding film 20 with respect to a light with wavelength of 193 nm may be 1.3% or more. The transmittance of the light shielding film 20 with respect to a light with wavelength of 193 nm may be 1.4% or more. The transmittance of the light shielding film 20 with respect to a light with wavelength of 193 nm may be 2% or less.

The light shielding film 20 may have an optical density of 1.8 or more with respect to a light with wavelength of 193 nm. The light shielding film 20 may have an optical density of 1.9 or more with respect to a light with wavelength of 193 nm. The light shielding film 20 may have an optical density of 3 or less with respect to a light with wavelength of 193 nm.

In such a case, a thin film including the light shielding film 20 can effectively suppress the transmission of an exposure light.

Other Thin Films

FIG. 4 is a conceptual view for illustrating a blank mask 100 according to another embodiment of the present disclosure. With reference to the FIG. 4, a blank mask of an embodiment is described.

A phase shift film 30 may be disposed between a transparent substrate 10 and a light shielding film 20. The phase shift film 30 is a thin film for attenuating the intensity of an exposure light transmitting the phase shift film 30 and adjusting the phase difference to suppress a diffractive light occurring at the edge of a pattern, substantially.

The phase shift film 30 may have a phase difference of 170° to 190° with respect to a light with wavelength of 193 nm. The phase shift film 30 may have a difference of 175° to 185° with respect to a light with wavelength of 193 nm. The phase shift film 30 may have a transmittance of 3% to 10% with respect to a light with wavelength of 193 nm. The phase shift film 30 may have a transmittance of 4% to 8% with respect to a light with wavelength of 193 nm. In such a case, the resolution of a photomask 200, in which the phase shift film 30 has been included, may be increased.

The phase shift film 30 may include a transition metal and silicon. The phase shift film 30 may include a transition metal, silicon, oxygen, and nitrogen. The transition metal may be molybdenum.

A hard mask (not shown) may be disposed on the light shielding film 20. The hard mask may function as an etching mask film when a light shielding film 20 pattern is etched. The hard mask may include silicon, nitrogen, and oxygen.

Photomask

Figure 5:
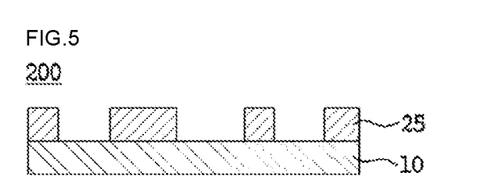
FIG. 5 is a conceptual view for illustrating the photomask according to another embodiment of the present disclosure.

FIG. 5 is a conceptual view for illustrating a photomask according to another embodiment of the present disclosure. With reference to the FIG. 5, a photomask 200 of an embodiment is described.

A photomask 200 according to another embodiment includes a transparent substrate 10 and a light shielding pattern film 25 disposed on the transparent substrate 10.

The light shielding pattern film 25 includes a transition metal and at least any one of oxygen and nitrogen.

An upper surface of the photomask 200 includes nine sectors formed by trisecting the upper surface of the photomask 200 vertically and horizontally.

An average value of nine Rsk values measured at respective sectors of the surface of the light shielding pattern film 25 disposed on the upper surface of the photomask 200 is equal to −0.64 or more and less than or equal to 0.

The average value of nine Rku values measured at respective sector of the surface of the light shielding pattern film 25 disposed on the upper surface of the photomask 200 is 3 or less.

The light shielding pattern film 25 may be formed by patterning the light shielding film 20 of the blank mask described above.

The method of measuring the average value of nine Rsk values and the average value of nine Rku value measured at respective sector of the surface of the light shielding pattern film 25 disposed on the upper surface of the photomask is the same as the method of measuring the average value of nine Rsk values and the average value of nine Rku values measured at respective sectors of the surface of the light shielding film 20 from the blank mask 100.

The description of the properties, composition, and structure of the light shielding pattern film 25 is overlapped with the description of the light shielding film 20 of the blank mask 100 and thus omitted.

Manufacturing Method of Light Shielding Film

A manufacturing method of a blank mask according to one embodiment of the present disclosure may include a preparing operation for setting a transparent substrate and a sputtering target to have a distance of 260 mm to 300 mm between the transparent substrate and the sputtering target in a sputtering chamber.

The manufacturing method of a blank mask according to one embodiment of the present disclosure may include a film formation operation for injecting an atmospheric gas into a sputtering chamber, supplying an electric power to a sputtering target and rotating a transparent substrate at 25 rpm or more to form a light shielding film.

The film formation operation may include a first light shielding layer formation process, which forms a first light shielding layer on the transparent substrate; and a second light shielding layer formation process, which forms a second light shielding layer on the first light shielding layer.

The manufacturing method of a blank mask according to one embodiment may include a thermal treatment operation for dividing the surface of the light shielding film to be 25 districts pentasected vertically and horizontally, and thermally treating the 25 districts at temperatures controlled respectively and independently.

The thermal treatment operation may be performed at a temperature of 200° C. to 400° C.

The thermal treatment operation may be performed for a time of 5 minutes to 30 minutes.

The manufacturing method of a blank mask according to one embodiment of the present disclosure may include a cooling operation for cooling the light shielding film after the thermal treatment operation.

In the preparing operation, a sputtering target may be selected in consideration of the composition of the light shielding film. The sputtering target may be one target containing a transition metal. The sputtering target may be two or more targets including one target containing a transition metal. The target containing a transition metal may include the transition metal in an amount of 90 at % or more. The target containing a transition metal may include the transition metal in an amount of 95 at % or more. The target containing a transition metal may include the transition metal in an amount of 99 at % or more.

The transition metal may include at least one selected from the group consisting of Cr, Ta, Ti, and Hf. The transition metal may include Cr.

The description of the transparent substrate disposed in a sputtering chamber is overlapped with the above description and thus omitted.

In the preparing operation, the distance between the transparent substrate and the sputtering target refers to a perpendicular distance (T/S distance) between the center point of the sputtering target and the plane including the upper surface of the transparent substrate.

In the preparing operation, the transparent substrate and the sputtering target may be disposed to have a distance of 260 mm to 300 mm between the transparent substrate and the sputtering target. The transparent substrate and the sputtering target may be disposed to have a distance of 270 mm to 290 mm between the transparent substrate and the sputtering target. In such a case, the thickness variation width of the light shielding film in the in-plane direction can be decreased. Also, density of the light shielding film to be formed is increased and thus controlling the roughness characteristics of the surface of the light shielding film through a thermal treatment operation and a cooling operation can be easy.

In the preparing operation, a magnet may be disposed at the sputtering chamber. The magnet may be disposed on the surface opposite to one surface where sputtering occurs from the sputtering target.

In the preparing operation, the conditions of a film formation process may be applied differently when respective layers included in the light shielding film is formed. Particularly, in consideration of the characteristics of extinction and etching of the light shielding film, various process conditions such as the composition of an atmospheric gas, the electric power supplied to a sputtering target, and the time for film formation may be different by layers.

In the film formation operation, the rotation speed of the substrate may be 25 rpm or more. The rotation speed may be 30 rpm or more. The rotation speed may be 100 rpm or less. In such a case, the thickness variation of the light shielding film to be formed in the in-plane direction may be effectively decreased. Also, the surface roughness characteristics of respective sectors on the surface of the light shielding film may be adjusted within the predetermined ranges in the embodiment.

The atmospheric gas may include an inert gas, a reactive gas, and a sputtering gas. The inert gas is a gas not including an element composing the formed thin film. The reactive gas is a gas including an element composing the formed thin film. The sputtering gas is a gas ionized at plasma atmosphere to collide with a target.

The inert gas may include helium.

The reactive gas may include a gas including a nitrogen element. The gas including the nitrogen element may be for example, $N_2$, $NO$, $NO_2$, $N_2O$, $N_2O_3$, $N_2O_4$, $N_2O_5$ or the like.

The reactive gas may include a gas including an oxygen element. The gas including the oxygen element may be for example $O_2$, $CO_2$, or the like. The reactive gas may include a gas including a nitrogen element and a gas including an oxygen element. The reactive gas may include a gas including both nitrogen element and oxygen element. The gas including both nitrogen element and oxygen element may be for example. $NO$, $NO_2$, $N_2O$, $N_2O_3$, $N_2O_4$, $N_2O_5$ or the like.

The sputtering gas may be Ar gas.

The power source for supplying an electric power to a sputtering target may be DC power source, or RF power source.

In the film formation process of a first light shielding layer 21, the electric power supplied to be a sputtering target may be applied to be equal to 1.5 kW or more and less than or equal to 2.5 kW. In the film formation process of a first light shielding layer 21, the electric power supplied to a sputtering target may be applied to be equal to 1.6 kW or more and less than or equal to 2 kW.

In the film formation process of a first light shielding layer 21, a ratio of the flow rate of a reactive gas to the flow rate of an inert gas in an atmosphere gas may be equal to 1.5 or more and less than or equal to 3. The ratio may be equal to 1.8 or more and less than or equal to 2.7. The ratio may be equal to 2 or more and less than or equal to 2.5.

The ratio of the oxygen amount to the nitrogen amount included in a reactive gas may be equal to 1.5 or more and less than or equal to 4. The ratio of the oxygen amount to the nitrogen amount included in a reactive gas may be equal to 2 or more and less than or equal to 3. The ratio of the oxygen amount to the nitrogen amount included in a reactive gas may be equal to 2.2 or more and less than or equal to 2.7.

In such a case, the first light shielding layer 21 can help the light shielding film 20 to have a sufficient extinction characteristic. Also, the first light shielding layer 21 improves the etching rate thereof and can help the side surface profile of the light shielding pattern film 25 formed through patterning of the light shielding film 20 to have a shape perpendicular to the transparent substrate 10.

The time for the formation of the first light shielding layer 21 may be equal to 200 seconds or more and less than or equal to 300 seconds. The time for the formation of the first light shielding layer 21 may be equal to 210 seconds or more and less than or equal to 240 seconds. In such a case, the first light shielding layer 21 can help the light shielding film 20 to have a sufficient extinction characteristic.

In the formation process of the second light shielding layer 22, the electric power supplied to a sputtering target may be applied to be equal to 1 kW or more and less than or equal to 2 kW. In the formation process of the second light shielding layer 22, the electric power supplied to a sputtering target may be applied to be equal to 1.2 kW and less than or equal to 1.7 kW.

In the formation process of the second light shielding layer 22, the ratio of the flow rate of a reactive gas to the flow rate of an inert gas in the atmosphere gas may be equal to 0.3 or more and less than or equal to 0.8. The ratio may be equal to 0.4 or more and less than or equal to 0.6.

In the formation process of the second light shielding layer 22, the ratio of the oxygen amount to the nitrogen amount included in the reactive gas may be 0.3 or less. The ratio of the oxygen amount to the nitrogen amount included in the reactive gas may be 0.1 or less. The ratio of the oxygen amount to the nitrogen amount included in the reactive gas may be 0.001 or more.

In such a case, the above amount ratio can help the light shielding film 20 to have a stable extinction characteristic.

The time of the formation of the second light shielding layer 22 may be equal to 10 seconds or more and less than or equal to 30 seconds. The time of the formation of the second light shielding layer 22 may be equal to 15 seconds or more and less than or equal to 25 seconds. In such a case, the second light shielding layer 22 may be included in the light shielding film 20, thereby helping to suppress the transmission of an exposure light.

Figure 6:
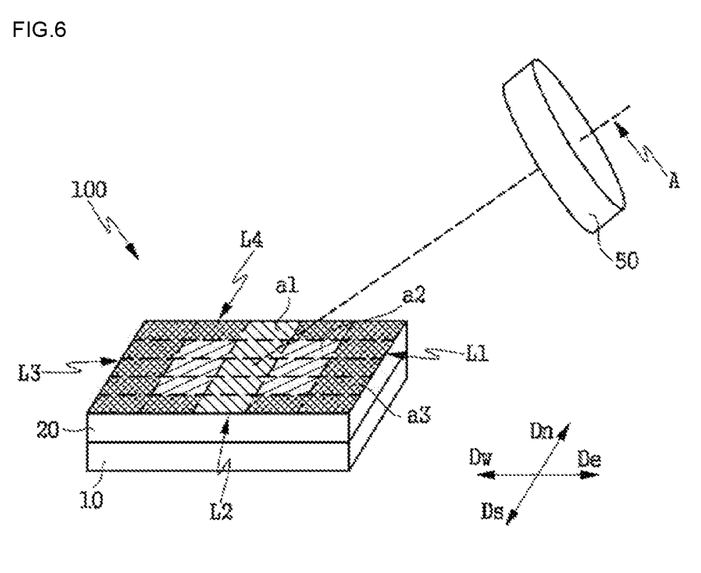
FIG. 6 is a conceptual view for illustrating a surface of a light shielding film disposed in a sputtering chamber immediately after completion of a film formation operation with a sputtering target.

FIG. 6 is a conceptual view for illustrating the surface of the light shielding film disposed in a sputtering chamber immediately after the film formation operation. Hereinafter, an embodiment is described with reference to the FIG. 6.

The surface of the light shielding film 20 disposed in the chamber immediately after the film formation operation includes a first side (L1), a second side (L2), a third side (L3) and a fourth side (L4) that are edges arranged orderly in the clockwise direction. The first side (L1) is an edge placed to be the closest from a sputtering target among the four edges.

The direction facing the first side (L1) from the center of the surface of the light shielding film 20 is referred to as the east direction (De). The direction facing the third side (L3) from the center of the surface of the light shielding film 20 is referred to as the west direction (Dw). The direction facing the fourth side (L4) from the center of the surface of the light shielding film 20 is referred to as the north direction (Dn). The direction facing the second side (L2) from the center of the surface of the light shielding film 20 is referred to as the south direction (Ds). The surface of the light shielding film 20 includes twenty-five districts formed by pentasecting the surface of the light shielding film 20 vertically and horizontally.

The first district (a1) among the twenty-five districts consists of a district placed at the center of the surface of the light shielding film 20, two districts placed in the north direction (Dn) from the district placed at the center and two districts placed in the south direction (Ds) from the district placed at the center. The second district (a2) consists of districts not disposed to be in contact with the second side (L2) or the fourth side (L4) among the districts disposed to be in contact with the first district (a1). The third district (a3) consists of districts not corresponding to the first district (a1) and the second district (a2).

When the surface of the light shielding film 20 immediately after the film formation operation is inspected for defects with a high sensitivity, more pseudo defects are detected in outer portion of the surface of the light shielding film 20, compared to the center of the light shielding film 20. This is thought because the outer portion of the light shielding film 20 has a relatively low density compared to the center of the light shielding film 20.

Incidentally, the first district (a1) of the surface of the light shielding film 20 after the film formation operation may have a relatively uniform distribution in the roughness characteristics. This is thought because deposition of sputtering particles proceeds temporarily even after the film formation operation is end. Even though supplying an electric power to a sputtering target 50 is end and the rotation of the transparent substrate 10 is discontinued, sputtering may occur on the surface of the light shielding film 20 temporarily by sputtering particles remaining in a chamber. At this time, respective spots included in the first district (a1) forms similar distances with the surface of the sputtering target 50, and the surface of the light shielding film 20 corresponding to the first district (a1) may allow sputtering particles having an energy distribution in a relatively narrow range to be deposited. Through the above, relatively uniform distribution in the roughness characteristics can be exhibited in the first district (a1).

The embodiment may perform thermal treatment and cooling treatment by applying different conditions by districts of the light shielding film 20 after the completion of the film formation operation. In such a case, it is possible to provide a light shielding film, in which the number of pseudo defects effectively decreased, and the variation of accuracy in the defect inspection depending on detected position is suppressed when a highly sensitive defect inspection is performed, in addition to having a relatively uniform thickness.

In the thermal treatment operation, twenty-five districts on the surface of the light shielding film 20 may be treated with heat at temperatures controlled respectively and independently. In detail, heaters may be installed by districts over the surface of the light shielding film. The heaters by districts may be installed on the side of a transparent substrate.

The temperatures of heaters by districts may be independently and respectively controlled within the range of 200° C. to 400° C.

In the thermal treatment operation, the thermal treatment temperature refers to a temperature of a heater in each district.

In the first district (a1), thermal treatment may be performed at a temperature of 150° C. to 350° C. In the first district (a1), thermal treatment may be performed at a temperature of 200° C. to 300° C.

In the third district (a3), thermal treatment may be performed at a temperature of 200° C. to 400° C. In the third district (a3), thermal treatment may be performed at a temperature of 250° C. to 350° C. The value of subtracting a temperature for thermal treatment applied to the first district (a1) from a temperature for the thermal treatment applied to the third district (a3) may be 20° C. to 70° C.

The second district (a2) is placed in contact with the third district, which is treated with heat at a relatively high temperature compared to the first district (a1). The heat generated during the thermal treatment of the third district (a3) may affect the second district (a2). In consideration of the above, the thermal treatment temperature for the second district (a2) may be between the temperature for thermal treatment of the first district (a1) and the temperature for thermal treatment of the third district (a3). The temperature for thermal treatment of the second district (a2) may be same as the temperature for thermal treatment of the first district (a1).

The thermal treatment operation may be performed for a time of 5 minutes to 30 minutes. The thermal treatment may be performed for a time of 10 minutes to 20 minutes. In such a case, accuracy of a defect inspection can be improved in the whole area of the surface of the light shielding film 20. Also, the internal stress of the light shielding film can be effectively solved.

The blank mask 100 may be subject to a cooling operation within 2 minutes after the thermal treatment operation. In such a case, the growth of a crystal grain of transition metal particles caused from residual heat in the light shielding film 20 can be effectively prevented.

In the cooling operation, the cooling rate of the blank mask 100 can be controlled by setting a pin having a predetermined length on each edge of a cooling plate, and arranging the blank mask 100 to have a substrate facing the cooling plate on the pin.

In the cooling operation, the cooling temperature applied to the cooling plate may be equal to 10° C. or more and less than or equal to 30° C. The cooling temperature may be equal to 15° C. or more and less than or equal to 25° C.

In the cooling operation, the distance between the blank mask 100 and the cooling plate may be equal to 0.01 mm or more and less than or equal to 30 mm. The distance may be equal to 0.05 mm or more and less than or equal to 5 mm. The distance may be equal to 0.1 mm or more and less than or equal to 2 mm.

In the blank mask 100, when the cooling treatment is performed by installing a cooling plate on the side of the transparent substrate, the cooling rate of side of the light shielding film 20 may be somewhat low compared to the transparent substrate. Accordingly, the residual heat formed in the light shielding film 20 can be further effectively removed through a method of injecting a cooling gas on the surface of the light shielding film while the cooling treatment is performed through the cooling plate.

The cooling rate can be controlled by districts by injecting a cooling gas on the first side (L1) and the third side (L3) of the surface of the light shielding film 20.

In the thermal treatment operation, the third district (a3) of the surface of the light shielding film 20 may be thermally treated at a relatively high temperature for thermal treatment compared to the first district (a1) and the second district (a2). In such a case, the third district (a3) may have a relatively high possibility of recrystallization of transition metal and the growth of a grain caused from residual heat, when compared to other districts. When the growth of a grain of transition metal particles is not controlled, deformation may occur on the surface outline of the third district (a3) and a variation of the roughness characteristics may be caused. This may become a cause of degrading the accuracy of a defect inspection.

Accordingly, nozzles for injecting a cooling gas may be disposed on the first side (1) and the third side (L3) of the light shielding film to improve the cooling rate of the third district (a3) disposed on the first side (L1) and the third side (L3), and thereby can effectively prevent the growth of a grain of the transition metal, which may be generated particularly in the third district (a3).

The cooling gas may be an inert gas. The cooling gas may be for example, helium.

In the cooling operation, the nozzle for injecting a cooling gas may be installed to form an angle of 40° to 80° with a plane including the surface of the light shielding film.

In the cooling operation, the flow rate of the cooling gas injected through the nozzle may be equal to 10 sccm or more and less than or equal to 90 sccm. The flow rate may be equal to 30 sccm or more and less than or equal to 70 sccm.

In the cooling operation, the cooling rate measured at the third district (a3) may be relatively higher than the first district (a1) and the second district (a2).

The cooling rate of the third district (a3) may be equal to 0.6° C./s or more and less than or equal to 1.2° C./s. The cooling rate of the third district (a3) may be equal to 0.8° C./s or more and less than or equal to 1° C./s.

The cooling rate of the first district (a1) and the second district (a2) may be equal to 0.4° C./s or more and less than or equal to 1° C./s. The cooling rate of the first district (a1) and the second district (a2) may be equal to 0.6° C./s or more and less than or equal to 0.8° C./s.

When the cooling rate of the first district (a1) is subtracted from the cooling rate of the third district (a3), a value of 0.05° C./s to 0.3° C./s may be obtained.

The cooling operation may be performed for a time of 1 minute to 10 minutes. The cooling operation may be performed for a time of 3 minutes to 7 minutes.

In such a case, a variation of the roughness characteristics of the surface of the light shielding film caused from residual heat in the light shielding film can be effectively prevented.

Manufacturing Method of Semiconductor Element

A manufacturing method of a semiconductor element according to another embodiment includes a preparing operation for arranging a semiconductor wafer, to which a resist film have been applied, a light source, and a photomask 100; an exposure operation for selectively transmitting a light incident from the light source on the semiconductor wafer through the photomask 200 to be transferred; and a development operation for developing a pattern on the semiconductor wafer.

The photomask 200 includes a transparent substrate 10 and a light shielding pattern film 25 disposed on the transparent substrate 10.

The light shielding pattern film 25 includes a transition metal and at least of oxygen and nitrogen.

An upper surface of the photomask 20 includes nine sectors formed by trisecting the upper surface of the photomask 200 vertically and horizontally.

The upper surface of the photomask 200 has nine Rsk values, respectively, measured from the nine sectors disposed on the upper surface of the light shielding pattern film, and the average value of the nine Rsk values may be equal to −0.64 or more and less than or equal to 0.

The upper surface of the photomask 200 has nine Rku values, respectively, measured from the nine sectors disposed on the upper surface of the light shielding pattern film, and the average value of the nine Rku value may be 3 or less.

In the preparation, the light source is a device, which can generate an exposure light with a short wavelength. The exposure light may be a light with wavelength of 200 nm or less. The exposure light may be ArF light with wavelength of 193 nm.

A lens may be additionally disposed between the photomask 200 and the semiconductor wafer. The lens has a function of reducing the shape of a circuit pattern on the photomask 200 to be transferred on the semiconductor wafer. Any lens, which can be ordinarily applied to an exposure process for ArF semiconductor wafer, is applicable without limitation. For example, the lens may be a lens consisting of calcium fluoride (CaF2).

In the exposure operation, an exposure light may be selectively transmitted on the semiconductor wafer through a photomask 200. In such a case, a chemical modification may occur in the portion, to which the exposure light is incident within the resist film.

In the development operation, a pattern may be developed on the semiconductor wafer by treating the semiconductor wafer after completion of the exposure operation with a developing solution. When the applied resist film is a positive resist, the portion, to which the exposure light is incident, may be dissolved by the developing solution. When the applied resist film is a negative resist, the portion, to which the exposure light is not incident, may be dissolved by the developing solution. The resist film is formed into a resist pattern by the treatment with the developing solution. A pattern may be formed on the semiconductor wafer by taking the resist pattern as a mask.

The description of the photomask 200 is overlapped with the above description and thus omitted.

Hereinafter, further detailed description of the specific example embodiments will be made.

Manufacture Example: Formation of Light Shielding Film

Example 1: a transparent substrate made from a quartz material with a width of 6 inches, a length of 6 inches, and a thickness of 0.25 inches was disposed in a chamber of DC sputtering apparatus. A chrome target was disposed to form T/S distance of 280 mm and the angle between the substrate and the target of 25 degrees.

Thereafter, an atmospheric gas, in which Ar of 21 volume %, $N_2$ of 11 volume %, $CO_2$ of 32 volume %, and He of 36 volume % had been mixed, was introduced in the chamber, the electric power supplied to the sputtering target was 1.85 kW, the rotation speed of the substrate was 30 rpm, and a sputtering process was performed for 250 seconds, thereby forming a first light shielding layer.

After the formation of the first light shielding layer, an atmospheric gas, in which Ar of 57 volume % and $N_2$ or 43 volume % had been mixed, was introduced in the chamber, the electric power supplied to the sputtering target was 1.5 kW, the rotation speed of the substrate was 30 rpm, and a sputtering process was performed for 25 seconds, thereby manufacturing a sample of a blank mask to which a second light shielding layer had been formed.

The sample after the formation of the second light shielding layer was disposed in the chamber for thermal treatment, and heaters were installed at respective districts on the substrate of the sample. Subsequently, the temperatures of heaters of the first district and the second district were set to be 250° C., the temperature of the heater of the third district was applied to be 300° C., and thermal treatment was performed for 15 minutes.

A cooling plate with the cooling temperature of 23° C. was installed on the substrate of the sample after the thermal treatment. On the first side and the third side of the surface of the light shielding film, respectively, three nozzles were installed to form an angle of 70° C. between the nozzle and the plane including the substrate surface. Subsequently, a cooling gas was injected in the flow rate of 50 sccm to perform cooling treatment for 5 minutes. The cooling gas was helium.

The cooling rate was measured to be 0.91° C./s at one spot within the third district of the surface of the light shielding film, and the cooling rate was measured to be 0.76° C./s at one spot within the first district and at one spot within the second district of the surface of the light shielding film.

Example 2: A blank mask sample was manufactured under the same condition as the Example 1. However, the T/S value was applied to be 290 mm and the rotation speed of the substrate was 40 rpm when a light shielding film was formed.

Example 3: A blank mask sample was manufactured under the same condition as the Example 1. However, the rotation speed of the substrate was 40 rpm when a light shielding film was formed.

Comparative Example 1: A blank mask sample was manufactured under the same condition as the Example 1. However, T/S value was 290 mm when alight shielding film was formed. For the thermal treatment, it was performed for 15 minutes by applying a temperature of each heater to be 250° C. in the whole area of the light shielding film. For the cooling treatment, a cooling plate, to which a cooling temperature of 23° C. had been applied, was installed on the substrate of the sample to perform cooling treatment for 5 minutes. A cooling gas was not applied thereto.

Comparative Example 2: A blank mask sample was manufactured under the same condition as the Comparative Example 1. However, the T/S value was 280 mm when the light shielding film was formed, and the rotation speed of the substrate was 20 rpm.

Comparative Example 3: A blank mask sample was manufactured under the same condition as the Comparative Example 1. However, the T/S value was 255 mm when the light shielding film was formed.

Comparative Example 4: A blank mask sample was manufactured under the same condition as the Comparative Example 1. However, the T/S value was 310 mm when the light shielding film was formed.

Conditions for the formation of a light shielding film, thermal treatment and cooling treatment of each Example or Comparative Example were described in Table 1 below.

Evaluation Example: Measurement of Roughness Characteristic of the Surface of Light Shielding Film The surface of the light shielding film of a sample of each Example or Comparative Example was divided into a total of nine sectors formed by trisecting vertically and horizontally.

Thereafter, Rsk and Rku were measured at the center of each sector. The center of each sector refers to an area of 1 μm vertically and horizontally, placed at the center portion of each sector.

Rsk and Rku were measured by using a two-dimensional roughness meter at non-contact mode with setting a scan speed to be 0.5 Hz. The roughness meter was XE-150 model available from PARK SYSTEM applied with PPP-NCHR, which is a Cantilever model available from PARK SYSTEM as a probe.

Thereafter, the average values, the standard deviations, a maximum value, and a minimum value of nine Rsk values and nine Rku values of each Example or Comparative Example were calculated from Rsk and Rku values measured from each sector.

The result of measurement and calculation of each Example or Comparative Example was described in Tables 2 and 3 below.

Evaluation Example: Measurement of Thickness Distribution of Light Shielding Film A first sample was manufactured by cutting a portion corresponding to the area of 5 cm vertically and horizontally, placed at the center of a sample of each Example or Comparative Example. A second sample was manufactured by cutting a portion corresponding to the area of 5 cm vertically and horizontally, placed at the left side of the sample center and including one side of the light shielding film. A third sample was manufactured by cutting a portion corresponding to the area of 5 cm vertically and horizontally, placed at the right side of the sample center and including another side opposite to the one side of the light shielding film. Thereafter, the upper surfaces of the first sample, second sample, and third sample (that is, the surface of a light shielding film) were treated by FIB (Focused Ion Beam), and after that TEM images of the samples were obtained by using JEM-2100F HR model available from JEOL LTD.

From TEM images of the samples, the first edge and second edge of the light shielding film were determined, and H1 as the thickness at the first edge (Le1) of the light shielding film, H2 as the thickness at the second edge of the light shielding film, and Hc as the thickness at the center spot (the center spot of an interface formed between the light shielding film and the transparent substrate) of the light shielding film were measured. A larger value between |Hc−H1| value and |Hc−H2| value was calculated from the H1, H2, and Hc values measured by Examples and Comparative Examples.

The result of measurement and calculation of each Example or Comparative Example was described in Table 4 below.

Evaluation Example: Measurement of Pseudo Defects Detected from Highly Sensitive Defect Inspection A defect inspection was performed by taking samples of Examples and Comparative Examples that had been kept in SMIF pod (Standard Mechanical InterFace Pod). In detail, from the surface of the light shielding film of a sample, an area of 146 mm vertically and horizontally placed at the center of the surface of the light shielding film was determined as a measuring portion.

The measuring portion was inspected by using M6641S model available from LASERTEC with the wavelength of 532 nm for an inspection light, a laser power of 0.4 to 0.5 based on a value set in the apparatus, and the stage speed of 2.

Thereafter, images of the measuring portion were measured, and the values corresponding to pseudo defects were distinguished from the result values according to the defect inspection by Examples and Comparative Examples, as described in Table 4 below.

TABLE 1

|  | T/S(mm) | Rotation Speed of Substrate (rpm) | Temperature for Thermal Treatment of First District and Second District (° C.) | Temperature for Thermal Treatment of Third District (° C.) | Cooling Speed of First District and Second District (° C./s) | Cooling Speed of Third District (° C./s) |
|---|---|---|---|---|---|---|
| Example 1 | 280 | 30 | 250 | 300 | 0.76 | 0.91 |
| Example 2 | 290 | 40 | 250 | 300 | 0.76 | 0.91 |
| Example 3 | 280 | 40 | 250 | 300 | 0.76 | 0.91 |
| Comparative Example 1 | 290 | 30 | 250 | 250 | 0.76 | 0.76 |
| Comparative Example 2 | 280 | 20 | 250 | 250 | 0.76 | 0.76 |
| Comparative Example 3 | 255 | 30 | 250 | 250 | 0.76 | 0.76 |
| Comparative Example 4 | 310 | 30 | 250 | 250 | 0.76 | 0.76 |

TABLE 2

|  |  | Example 1 | Example 2 | Example 3 | Comparative Example 1 | Comparative Example 2 | Comparative Example 3 | Comparative Example 4 |
|---|---|---|---|---|---|---|---|---|
| Sector 1 | Rsk | −0.399 | −0.928 | −0.387 | −0.925 | −0.405 | −0.377 | −1.355 |
|  | Rku | 2.494 | 3.835 | 2.491 | 3.723 | 2.673 | 2.455 | 4.712 |
| Sector 2 | Rsk | −0.686 | −0.419 | −0.676 | −0.422 | −0.754 | −0.698 | −0.887 |
|  | Rku | 2.815 | 2.369 | 2.803 | 2.360 | 3.017 | 2.717 | 3.394 |
| Sector 3 | Rsk | −0.463 | −0.318 | −0.459 | −0.317 | −0.516 | −0.435 | −0.761 |
|  | Rku | 2.313 | 2.261 | 2.3 | 2.263 | 2.528 | 2.333 | 3.245 |
| Sector 4 | Rsk | −0.599 | −0.301 | −0.608 | −0.311 | −0.651 | −0.602 | −0.783 |
|  | Rku | 2.511 | 2.241 | 2.514 | 2.260 | 2.792 | 2.497 | 3.207 |
| Sector 5 | Rsk | −0.321 | 0.278 | −0.325 | 0.274 | −0.422 | −0.316 | 0.715 |
|  | Rku | 2.138 | 2.323 | 2.141 | 2.334 | 2.355 | 2.145 | 3.334 |
| Sector 6 | Rsk | −0.205 | −0.599 | −0.2 | 0.202 | −0.464 | −0.316 | 0.716 |
|  | Rku | 2.849 | 4.063 | 2.843 | 3.534 | 3.351 | 2.617 | 4.533 |
| Sector 7 | Rsk | −0.891 | −0.563 | −0.89 | −1.135 | −1.121 | −0.903 | −1.533 |
|  | Rku | 3.199 | 2.455 | 3.195 | 4.012 | 3.712 | 3.182 | 5.327 |
| Sector 8 | Rsk | −0.876 | −0.673 | −0.888 | −1.148 | −1.107 | −0.887 | −1.581 |
|  | Rku | 2.962 | 2.537 | −1.148 | 4.105 | 3.697 | 2.924 | 5.450 |
| Sector 9 | Rsk | −1.213 | −1.262 | 4.046 | −1.487 | −1.513 | −1.273 | −2.194 |
|  | Rku | 4.048 | 4.176 | −1.487 | 4.876 | 4.652 | 3.784 | 6.806 |

TABLE 3

|  | Rsk Average Value | Rku Average Value | Standard Deviation of Rsk Values * | Standard Deviation Rku Values * | Maximu of Rsk Values | Minimum of Rsk Values | Maximum - Minimum of Rsk Values | Maximu of Rku Values | Minimum of Rku Values | Maximum - Minimum of Rku Values |
|---|---|---|---|---|---|---|---|---|---|---|
| Example 1 | −0.628 | 2.814 | 0.322 | 0.57 | −0.205 | −1.213 | 1.008 | 4.048 | 2.138 | 1.91 |
| Example2 | −0.532 | 2.918 | 0.431 | 0.84 | 0.278 | −1.262 | 1.54 | 4.176 | 2.241 | 1.935 |
| Example 3 | −0.627 | 2.813 | 0.324 | 0.57 | −0.2 | −1.211 | 1.011 | 4.046 | 2.141 | 1.905 |
| Comparative Example 1 | −0.585 | 3.274 | 0.62 | 0.99 | 0.274 | −1.487 | 1.761 | 4.876 | 2.26 | 2.616 |
| Comparative Example 2 | −0.773 | 3.197 | 0.39 | 0.732 | −0.405 | −1.513 | 1.108 | 4.652 | 2.355 | 2.297 |
| Comparative Example 3 | −0.645 | 2.739 | 0.327 | 0.499 | −0.316 | −1.273 | 0.957 | 3.784 | 2.145 | 1.639 |
| Comparative Example 4 | −0.851 | 4.445 | 0.999 | 1.263 | 0.716 | −2.194 | 2.91 | 6.806 | 3.207 | 3.599 |

* The standard deviations of Rsk and Rku values were applied by STDEW.S function available from Excel.

TABLE 4

| | Thickness Difference of Edge Portion Compared to the Center of Light shielding Film | Detected Pseudo Defects (Number) |
|---|---|---|
| Example 1 | Equal to 1 Å or more and less than 5 Å | 1~10 |
| Example 2 | Equal to 1 Å or more and less than 5 Å | 1~10 |
| Example 3 | Equal to 1 Å or more and less than 5 Å | 1~10 |
| Comparative Example 1 | Equal to 1 Å or more and less than 5 Å | 60~100 |
| Comparative Example 2 | Equal to 5 Å or more and less than 10 Å | 100~150 |
| Comparative Example 3 | Equal to 10 Å or more and less than 20 Å | 100~200 |
| Comparative Example 4 | Equal to 10 Å or more and less than 20 Å | 100~200 |

In the Table 3, Examples 1 to 3 exhibited cases including an average Rsk value of −0.64 to 0. However, Comparative Examples 2 to 4 showed values of −0.645 or less.

For the average value of Rku values, Examples 1 to 3 showed a value of 3 or less. However, Comparative Examples 1,2 and 4 showed a value of more than 3.

For the standard deviation of Rsk values, Examples 1 to 3 showed a value of 0.6 or less. However, Comparative Example 1 to 4 showed a value of more than 0.6.

For the standard deviation of Rku values, Examples 1 to 3 showed a value of 0.9 or less. However, Comparative Example 1 to 4 showed a value of more than 0.9.

In Examples 1 to 3, the maximum of Rku values was 4.6 or less, and the difference value between the maximum and the minimum of Rku values was 2.2 or less. However, in Comparative Examples 1,2 and 4, the maximum of Rku values was more than 4.6, and the difference value between the maximum and the minimum of Rku values was more than 2.2.

For the difference value between the maximum and the minimum of Rsk values, Examples 1 to 3 showed a value of 1.7 or less. However, Comparative Examples 1 to 4 showed a value of 1.7 or more.

For the thickness distribution of the light shielding film, Examples 1 to 3 was measured to have a difference value of less than 5 Å. However, Comparative Examples 1 to 4 were measured to have a value of 5 Å or more.

For the number of detected pseudo defects, Examples 1 to 3 detected pseudo defects of 10 or less. However, Comparative Examples 1 to 4 detected pseudo defects of 60 or more.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A blank mask comprising a transparent substrate and a light shielding film disposed on the transparent substrate,
    wherein the light shielding film comprises a transition metal and at least one selected from the group consisting of oxygen and nitrogen,
    wherein the transition metal comprises Cr,
    wherein when a surface of the light shielding film comprises nine sectors formed by trisecting the surface of the light shielding film vertically and horizontally, each of the nine sectors has a Rsk value, respectively, and an average value of the Rsk values of the nine sectors is equal to −0.64 or more and less than or equal to 0, where Rsk value is a height symmetry of the surface of the light shielding film measured in accordance with ISO_4287,
    wherein an average value of Rku values, which are kurtosis of the surface of the light shielding film measured in accordance with ISO_4287, of the nine sectors is 3 or less,
    wherein the light shielding film comprises a first light shielding layer and a second light shielding layer disposed on the first light shielding layer, and
    wherein an amount of the transition metal of the second light shielding layer is greater than an amount of the transition metal of the first light shielding layer.

2. The blank mask of claim 1, wherein a standard deviation value of the Rsk values of the nine sectors is 0.6 or less.

3. The blank mask of claim 1, wherein a standard deviation value of the Rku values of the nine sectors is 0.9 or less.

4. The blank mask of claim 1, wherein a difference between a maximum value and a minimum value of the Rku values of the nine sectors is 2.2 or less.

5. The blank mask of claim 4, wherein the maximum value of the Rku values of the nine sectors is 4.6 or less.

6. The blank mask of claim 1, wherein a difference between a maximum value and a minimum value of the Rsk values of the nine sectors is 1.7 or less.

7. The blank mask of claim 1, wherein a cross section of the light shielding film comprises a center, a first edge at one end, and a second edge at another end, and when a thickness of the light shielding film measured at the center is Hc, a thickness of the light shielding film measured at the first edge is H1, and a thickness of the light shielding film measured at the second edge is H2, a greater of |Hc−H1| and |Hc−H2| is less than 5 Å, where |Hc−H1| is an absolute value obtained by subtracting H1 from Hc and |Hc−H2| is an absolute value obtained by subtracting H2 from Hc.

8. The blank mask of claim 1, wherein the transition metal further comprises at least one selected from the group consisting of Ta, Ti, and Hf.

9. A photomask comprising a transparent substrate and a light shielding pattern film disposed on the transparent substrate,
    wherein the light shielding pattern film comprises a transition metal and at least one selected from the group consisting of oxygen and nitrogen,
    wherein the transition metal comprises Cr,
    wherein when an upper surface of the light shielding pattern film comprises nine sectors formed by trisecting the upper surface of the light shielding pattern vertically and horizontally, each of the nine sectors has a Rsk value, respectively, and an average value of the Rsk values of the nine sectors is equal to −0.64 or more and less than or equal to 0 where Rsk value is a height symmetry of the surface of the light shielding pattern film measured in accordance with ISO 4287, wherein an average value of Rku values, which are kurtosis of the surface of the light shielding pattern film measured in accordance with ISO_4287, of the nine sectors is 3 or less, wherein the light shielding pattern film comprises a first light shielding layer and a second light shielding layer disposed on the first light shielding layer, and wherein an amount of the transition metal of the second light shielding layer is greater than an amount of the transition metal of the first light shielding layer.

10. The photomask of claim 9, wherein a standard deviation value of the Rsk values of the nine sectors is 0.6 or less.

11. The photomask of claim 9, wherein a standard deviation value of the Rku values of the nine sectors is 0.9 or less.

12. The photomask of claim 9, wherein a difference between a maximum value and a minimum value of the Rku values of the nine sectors is 2.2 or less.

13. The photomask of claim 12, wherein the maximum value of the Rku values of the nine sectors is 4.6 or less.

14. The photomask of claim 9, wherein a difference between a maximum value and a minimum value of the Rsk values of the nine sectors is 1.7 or less.

15. The photomask of claim 9, wherein a cross section of the light shielding pattern film comprises a center, a first edge at one end, and a second edge at another end, and when a thickness of the light shielding pattern film measured at the center is Hc, a thickness of the light shielding pattern film measured at the first edge is H1, and a thickness of the light shielding pattern film measured at the second edge is H2, a greater of |Hc−H1| and |Hc−H2| is less than 5 Å, where |Hc−H1| is an absolute value obtained by subtracting H1 from Hc and |Hc−H2| is an absolute value obtained by subtracting H2 from Hc.

16. The photomask of claim 9, wherein the light shielding pattern film comprises a first light shielding pattern layer and a second light shielding pattern layer disposed on the first light shielding pattern layer, and an amount of the transition metal of the second light shielding pattern layer is greater than an amount of the transition metal of the first light shielding pattern layer.

17. The blank mask of claim 9, wherein the transition metal further comprises at least one selected from the group consisting of Ta, Ti, and Hf.

18. A method of manufacturing a semiconductor element comprising:

disposing a light source, a photomask, and a semiconductor wafer comprising a resist film disposed on a surface of the semiconductor wafer;

selectively transmitting a light incident from the light source through the photomask on the surface of the semiconductor wafer to be transferred; and developing a pattern on the surface of the semiconductor wafer, wherein the photomask comprises a transparent substrate and a light shielding pattern film disposed on the transparent substrate, wherein the light shielding pattern film comprises a transition metal and at least one selected from the group consisting of oxygen and nitrogen, wherein the transition metal comprises Cr, wherein when an upper surface of the light shielding pattern film comprises nine sectors formed by trisecting the upper surface of the light shielding pattern film vertically and horizontally, each of the nine sectors has a Rsk value, respectively, and an average value of the Rsk values of the nine sectors is equal to −0.64 or more and less than or equal to 0 where Rsk value is a height symmetry of the surface of the light shielding pattern film measured in accordance with ISO_4287, wherein an average value of Rku values, which are kurtosis of the surface of the light shielding pattern film measured in accordance with ISO_4287, of the nine sectors is 3 or less, wherein the light shielding pattern film comprises a first light shielding layer and a second light shielding layer disposed on the first light shielding layer, and wherein an amount of the transition metal of the second light shielding layer is greater than an amount of the transition metal of the first light shielding layer.

* * * * *